(12) United States Patent
Miyaake et al.

(10) Patent No.: US 6,333,466 B1
(45) Date of Patent: Dec. 25, 2001

(54) FLEXIBLE WIRING BOARD

(75) Inventors: Chiharu Miyaake; Yasufumi Miyake; Tetsuya Terada, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/441,959

(22) Filed: Nov. 17, 1999

(30) Foreign Application Priority Data

Nov. 18, 1998 (JP) .................................................. 10-328157

(51) Int. Cl.$^7$ ....................................................... H05K 1/00
(52) U.S. Cl. ......................... 174/254; 174/255; 174/256
(58) Field of Search ................................... 174/254, 255, 174/256, 258, 259; 361/749, 750

(56) References Cited

U.S. PATENT DOCUMENTS

| | | | |
|---|---|---|---|
| 5,084,124 | * | 1/1992 | Taniguchi ............................ 156/315 |
| 5,260,518 | * | 11/1993 | Tanaka et al. ....................... 174/261 |
| 5,615,088 | * | 3/1997 | Mizumo .............................. 361/749 |
| 5,637,382 | * | 6/1997 | Millette et al. ..................... 428/209 |
| 5,880,935 | * | 3/1999 | Wiesa et al. ........................ 361/743 |

FOREIGN PATENT DOCUMENTS

| | | |
|---|---|---|
| A-62-115887 | 5/1987 | (JP) . |
| A-2-222193 | 9/1990 | (JP) . |
| A-6-164085 | 6/1994 | (JP) . |

OTHER PUBLICATIONS

65–629 A (1999) Influence of Visco Elastic Properties in Plastics Material on the Reliability of Flexible Printed Circuits under Bending (Improvement on Bending Lifetime due to Energy Transformation), 7 pages.

* cited by examiner

*Primary Examiner*—Jeffrey Gaffin
*Assistant Examiner*—Jeremy Norris
(74) *Attorney, Agent, or Firm*—Sughrue Mion, PLLC

(57) ABSTRACT

A flexible wiring board which exhibits a sufficient flex life under high temperature working conditions. The flexible wiring board comprises an insulation layer provided on both surfaces of a conductor layer, optionally with an adhesive layer provided interposed therebetween, wherein the layers being in direct contact with both surfaces of the conductor layer exhibit an average complex shear modulus value of from $1.0 \times 10^{10}$ to $4 \times 10^{10}$ dyn/cm$^2$ at a temperature of 60° C. and a frequency of 25 Hz.

8 Claims, 2 Drawing Sheets

FLEXIBLE WIRING BOARD

FIELD OF THE INVENTION

The present invention relates to a flexible wiring board for use in the wiring of electric apparatus, electronic apparatus, etc.

BACKGROUND OF THE INVENTION

A flexible wiring board has good flexing characteristics and thus has heretofore been used in the wiring of electric apparatus and electronic apparatus, particularly in the wiring of mobile members in computer peripheral such as HDD and CD-ROM.

Such a flexible wiring board is prepared, e.g., by laminating a conductor layer such as metal foil on an insulation layer such as plastic film optionally with an adhesive layer of synthetic resin or the like provided interposed therebetween, subjecting the conductor layer to etching or other treatments to form a predetermined circuit pattern thereon, and then laminating an insulation layer on the conductor layer optionally with an adhesive layer provided interposed therebetween.

In recent years, with the enhancement of the performance and improvement in the mobility of electric apparatus and electronic apparatus, particularly computer peripheral, the internal temperature in these apparatus tends to rise more and more. It has thus been desired to develop a flexible wiring board which exhibits a sufficient flex life under working conditions causing such a temperature rise.

SUMMARY OF THE INVENTION

It is therefore an object of the present invention to provide a flexible wiring board which exhibits a sufficient flex life under high temperature working conditions.

The foregoing object of the present invention will become apparent from the following detailed description and examples.

The foregoing object of the present invention is accomplished with a flexible wiring board comprises an insulation layer provided on both surfaces of a conductor layer, optionally with an adhesive layer provided interposed therebetween, wherein the layers being in direct contact with both surfaces of the conductor layer exhibit an average complex shear modulus value of from $1.0 \times 10^{10}$ to $4 \times 10^{10}$ dyn/cm$^2$ at a temperature of 60° C. and a frequency of 25 Hz.

More specifically, the foregoing object of the present invention is accomplished with (1) a flexible wiring board comprising an insulation layer provided on both surfaces of a conductor layer with an adhesive layer provided interposed therebetween, characterized in that the adhesive layers in direct contact with both surfaces of the conductor layer exhibit an average complex shear modulus value of from $1.0 \times 10^{10}$ to $4 \times 10^{10}$ dyn/cm$^2$ at a temperature of 60° C. and a frequency of 25 Hz, (2) a flexible wiring board comprising an insulation layer provided on one surface of a conductor layer with an adhesive layer provided interposed therebetween and an insulation layer provided on the other free from adhesive layer, characterized in that the adhesive layer and insulation layer in direct contact with the respective surface of the conductor layer exhibit an average complex shear modulus value of from $1.0 \times 10^{10}$ to $4 \times 10^{10}$ dyn/cm$^2$ at a temperature of 60° C. and a frequency of 25 Hz, and (3) a flexible wiring board comprising an insulation layer provided on both surfaces of a conductor layer free from adhesive layer, characterized in that the insulation layers in direct contact with both surfaces of the conductor layer exhibit an average complex shear modulus value of from $1.0 \times 10^{10}$ to $4 \times 10^{10}$ dyn/cm$^2$ at a temperature of 60° C. and a frequency of 25 Hz.

BRIEF DESCRIPTION OF THE DRAWINGS

By way of example and to make the description more clear, reference is made to the accompanying drawings in which.

DETAILED DESCRIPTION OF THE INVENTION

Figure 1:
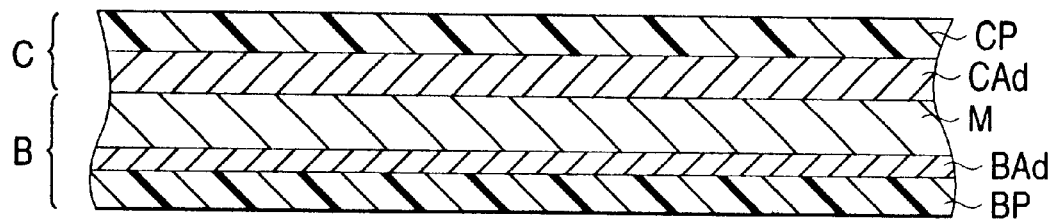
FIG. 1 is a sectional view illustrating an embodiment of the flexible wiring board according to the present invention.

As the conductor layer to be incorporated in the flexible wiring board of the present invention there may be used any material which is normally used as a conductor layer for flexible wiring board without any restriction. Examples of such a conductor layer material employable herein include metal such as copper, gold, stainless steel, aluminum and nickel, and alloy thereof. Preferred among these metals and alloys are copper and copper alloy taking into account the flexibility, workability, electrical characteristics and cost. The thickness of the conductor layer is normally from 0.002 to 0.100 mm, preferably from 0.005 to 0.070 mm. The conductor layer normally exhibits an elastic modulus of from 2,000 to 20,000 kg/mm$^2$ preferably from 4,000 to 12,000 kg/mm$^2$ as measured in foil form.

As the insulation layer to be incorporated in the flexible wiring board of the present invention there may be used any material which is normally used as an insulation layer for flexible wiring board without any restriction. Examples of such an insulation layer employable herein include plastic films such as polyimide film, polyether nitrile film, polyether sulfone film, polyethylene terephthalate film, polyethylene naphtalate film and polyvinyl chloride film. Preferred among these plastic films are polyethylene terephthalate film, polyethylene naphtalate film and polyimide film taking into account the heat resistance, dimensional stability, electrical characteristics, mechanical characteristics, chemical resistance and cost. Particularly preferred among these plastic films is polyimide film. Such a plastic film normally has a thickness of from about 10 to 300 μm, preferably from about 25 to 125 μm. Such a plastic film preferably has an elastic modulus of not less than 300 kg/mm$^2$ and a linear expansion coefficient of not more than $3 \times 10^{-5}$/° C.

As the adhesive which is optionally used to provide an insulation layer on the conductor layer in the flexible wiring board of the present invention there may be normally used any adhesive which can be used in the lamination of flexible wiring board without any restriction. Examples of such an adhesive employable herein include thermosetting adhesives such as epoxy-nitrile butyl rubber adhesive, epoxy-acrylic rubber adhesive, butyral adhesive and urethane adhesive, thermoplastic adhesives such as synthetic rubber adhesive, and acrylic adhesives such as pressure-sensitive adhesive. Preferred among these adhesives are thermosetting adhesives taking into account the adhesive force, heat resistance, moist heat resistance, workability and durability.

The flexible wiring board of the present invention comprising an insulation layer, a conductor layer and optionally an adhesive layer can be prepared by laminating an insulation layer with a conductor layer to prepare a substrate, forming a predetermined circuit pattern on the conductor layer in the substrate, and then laminating the substrate with a cover layer as an insulation layer.

Figure 2:
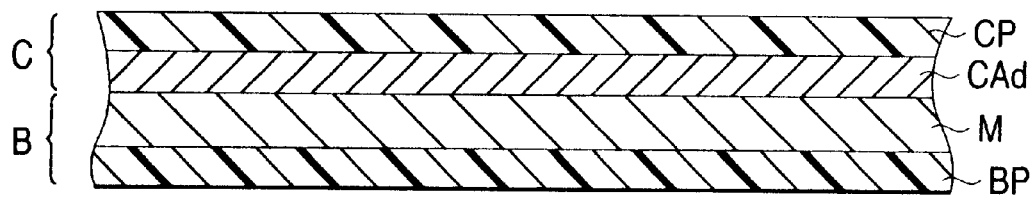
FIG. 2 is a sectional view illustrating another embodiment of the flexible wiring board according to the present invention.
Figure 3:
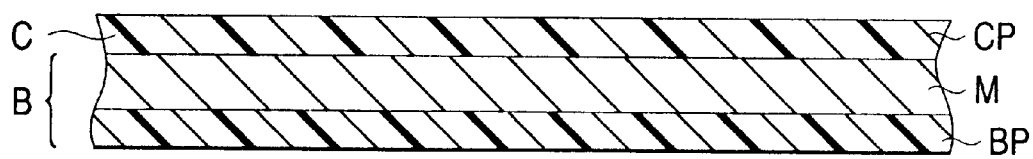
FIG. 3 is a sectional view illustrating a further embodiment of the flexible wiring board according to the present invention.

In some detail, the flexible wiring board of the present invention can be prepared in three embodiments, i.e., flexible wiring board comprising an insulation layer provided on both surfaces of a conductor layer with an adhesive layer provided interposed therebetween (as shown in FIG. 1), flexible wiring board comprising an insulation layer provided on one surface of a conductor layer with an adhesive layer provided interposed therebetween and an insulation layer provided on the other free from adhesive layer (as shown in FIG. 2) and flexible wiring board comprising an adhesive layer provided on both surfaces of a conductor layer free from adhesive layer (as shown in FIG. 3).

In some detail, in the preparation of the flexible wiring board comprising an insulation layer provided on both surfaces of a conductor layer with an adhesive layer provided interposed therebetween, an adhesive is applied to a substrate plastic film which acts as an insulation layer. Alternatively, a separator to which an adhesive has been applied is laminated onto a substrate plastic film. The separator is then removed. Thus, an adhesive layer is formed on the substrate plastic film. A metal foil as conductor layer is then laminated on the adhesive layer by contact-bonding or the like to prepare a substrate. The thickness of the adhesive layer is normally from 3 to 200 $\mu$m, preferably from 5 to 50 $\mu$m.

A predetermined circuit pattern is formed on the metal foil. The formation of such a circuit pattern can be accomplished by a known method such as printing method, subtractive method and additive method. In the present invention, subtractive method is preferably used.

Separately, an adhesive layer is formed on a cover layer plastic which acts as an insulation layer to prepare a cover layer in the same manner as mentioned above. The cover layer thus prepared was then laminated on the substrate to obtain a flexible wiring board. The lamination of the cover layer on the substrate can be accomplished by a process which comprises superposing the two components on one another in such an arrangement that the substrate plastic film and the cover layer plastic film face each other, temporarily bonding the two components to each other by contact-bonding method by hot pressing or lamination, and then applying at least one of heat and pressure to the laminate. The lamination method and conditions are properly determined by the kind of the plastic film and adhesive used.

As shown in FIG. 1, for example, the flexible wiring board thus prepared comprises a laminate of a substrate B consisting of three layers, i.e., substrate plastic film BP, adhesive layer BAd and metal foil M, and a cover layer C consisting of two layers, i.e., cover layer plastic film CP and adhesive layer CAd.

The preparation of the flexible wiring board comprising an insulation layer provided on one surface of a conductor layer with an adhesive layer provided interposed therebetween and an insulation layer provided on the other free from adhesive layer is accomplished by a process which comprises forming a substrate plastic film such as polyimide film directly on a metal foil, e.g., forming a film of monomer such as polyamic acid on a metal foil, drying and curing the coated material, to obtain a substrate, forming a predetermined circuit pattern on the metal foil in the same manner as mentioned above, and then laminating an adhesive layer and a cover layer made of cover layer plastic film on the substrate.

Alternatively, a thin metal film as a conductor layer may be directly formed on the substrate plastic film by electroplating method or sputtering method before the formation of a predetermined circuit pattern followed by the lamination of an adhesive layer and a cover layer made of cover layer plastic film thereon in the same manner as mentioned above.

As shown in FIG. 2, for example, the flexible wiring board thus prepared comprises a laminate of a substrate B consisting of two layers, i.e., substrate plastic film BP and metal foil M, and a cover layer C consisting of two layers, i.e., cover layer plastic film CP and adhesive layer CAd.

As the substrate obtained by forming a film of a polyamic acid solution on a metal foil and drying and curing the coated material so that a polyimide film is formed directly on the metal foil there may be used a commercially available product.

As opposed to the foregoing structure, a substrate consisting of three layers, i.e., substrate plastic film, adhesive layer and metal foil is prepared. Subsequently, a predetermined circuit pattern is formed on the substrate in the same manner as mentioned above. A film of monomer solution is formed, and then dried and cured on the metal foil so that a base plastic film is formed directly on the metal foil. In this manner, a flexible wiring board comprising a cover layer consisting of a cover layer plastic film alone laminated on a substrate consisting of three layers, i.e., substrate plastic film, adhesive layer and metal foil can be obtained.

The preparation of the flexible wiring board comprising an insulation layer provided on both surfaces of a conductor layer free from adhesive layer can be accomplished, e.g., by a process which comprises preparing a substrate in the same manner as mentioned above, e.g., by forming a film of monomer solution on a metal foil, and then drying and curing the film so that a cover plastic film is formed directly on the metal foil, or by forming a thin metal film directly on a base plastic film by electroplating or sputtering process, forming a predetermined circuit pattern in the same manner as mentioned above, and then again forming a film of monomer solution on the metal foil and drying and curing the film so that a base plastic film is formed directly on the metal foil.

As shown in FIG. 3, for example, the flexible wiring board thus prepared comprises a laminate of a substrate B consisting of two layers, i.e., substrate plastic film BP and metal foil M, and a cover layer C consisting of a cover layer plastic film CP alone.

In the flexible wiring board of the present invention thus prepared, the layers in direct contact with the respective surface of the conductor layer need to have a complex shear modulus of from $1.0\times10^{10}$ to $4\times10^{10}$ dyn/cm$^2$ at a temperature of 60° C. and a frequency of 25 Hz on an average.

In other words, among the foregoing three embodiments, the flexible wiring board comprising an insulation layer provided on both surfaces of a conductor layer with an adhesive layer provided interposed therebetween needs to have an arrangement such that the adhesive layers in direct contact with the respective surface of the conductor layer exhibit an average complex shear modulus value which falls within the above defined range at a temperature of 60° C. and a frequency of 25 Hz. The flexible wiring board comprising an insulation layer provided on one surface of a conductor layer with an adhesive layer provided interposed therebetween and an insulation layer provided on the other free from adhesive layer needs to have an arrangement such that the adhesive layer and insulation layer in direct contact with the respective surface of the conductor layer exhibit an average complex shear modulus value which falls within the above defined range at a temperature of 60° C. and a frequency of 25 Hz. Further, the flexible wiring board comprising an insulation layer provided on both surfaces of a conductor layer free from adhesive layer needs to have an arrangement such that the insulation layer in direct contact with both surfaces of the conductor layer exhibit an average complex shear modulus value which falls within the above defined range at a temperature of 60° C. and a frequency of 25 Hz.

The complex shear modulus at a temperature of 60° C. and a frequency of 25 Hz is normally represented by G* and can be normally determined by measuring the dynamic viscoelasticity using a dynamic viscoelastometer.

In some detail, using a dynamic viscoelastometer, for example, dynamic viscoelasticity may be measured in temperature dispersion mode at a frequency of 25 Hz to determine the complex shear modulus (G*) at a temperature of 60° C. Alternatively, dynamic viscoelasticity may be measured in frequency dispersion mode at a temperature of 60° C. to determine the complex shear modulus (G*) at a frequency of 25 Hz. Alternatively, dynamic viscoelasticity may be measured in temperature-frequency dispersion mode to determine the complex shear modulus (G*) at a temperature of 60° C. and a frequency of 25 Hz.

Alternatively, using a dynamic viscoelastometer, complex elastic modulus (E*) at a temperature of 60° C. and a frequency of 25 Hz may be measured. The complex elastic modulus (E*) thus measured can then be converted to complex shear modulus (G*) according to the following equation (1):

$$E^* = 2(1+\gamma)G^* \quad (1)$$

where $\gamma$ represents Poisson's ratio.

Alternatively, dynamic viscoelasticity may be measured in temperature dispersion mode at a frequency other than 25 Hz. From these results, complex shear modulus (G*) at a temperature which deviates from 60° C. by a predetermined temperature can be determined as complex shear modulus at a temperature of 60° C. and a frequency of 25 Hz according to temperature-time conversion rule.

Further, the foregoing methods may be combined to determine the complex shear modulus at a temperature of 60° C. and a frequency of 25 Hz. Referring to an example of such a method, dynamic viscoelasticity is measured in temperature dispersion mode at a frequency other than 25 Hz. Thus, the complex elastic modulus (E*) is then determined at various temperatures. Subsequently, from these results, complex elastic modulus (E*) at a temperature which deviates from 60° C. by a predetermined temperature is determined as complex elastic modulus (E*) at a temperature of 60° C. and a frequency of 25 Hz according to temperature-time conversion rule. Further, the complex elastic modulus (E*) can be converted according to the foregoing equation (1) to determine the complex shear modulus (G*) at a temperature of 60° C. and a frequency of 25 Hz.

If the average complex shear modulus (G*) value falls below $1.0 \times 10^{10}$ dyn/cm$^2$, a sufficient flex life cannot be obtained. On the contrary, if the average complex shear modulus (G*) value exceeds $4 \times 10^{10}$ dyn/cm$^2$, the resulting brittleness can shorten the flex life and drastically impairs the flexibility of flexible wiring board. Further, the complex shear modulus of these layers is more preferably from $1.3 \times 10^{10}$ to $2.7 \times 10^{10}$ dyn/cm$^2$.

More preferably, the flexible wiring board according to the present invention has an arrangement such that the layers in direct contact with the respective surface of the conductor layer exhibit an average complex shear modulus (G*) value of from $0.8 \times 10^{10}$ dyn/cm$^2$ to $3 \times 10^{10}$ dyn/cm$^2$ at a temperature of 80° C. and a frequency of 25 Hz. If the complex shear modulus (G*) at a temperature of 80° C. and a frequency of 25 Hz falls below $0.8 \times 10^{10}$ dyn/cm$^2$, a sufficient flex life may not be obtained. On the contrary, if the complex shear modulus (G*) at a temperature of 80° C. and a frequency of 25 Hz exceeds $3 \times 10^{10}$ dyn/cm$^2$, the resulting brittleness can shorten the flex life and drastically impair the flexibility of flexible wiring board.

The flexible wiring board according to the present invention mentioned above exhibits a sufficient flex life even under high temperature working conditions and thus is suitable for use with electric apparatus and electronic apparatus, particularly computer peripheral, which has recently shown a tendency for the rise in the internal temperature with the enhancement of performance and improvement of mobility.

Further, the flexible wiring board according to the present invention is effective when the average complex shear modulus of the layers in direct contact with the respective surface of the conductor layer at a temperature of 60° C. and a frequency of 25 Hz falls within the range of from $1.0 \times 10^{10}$ to $4 \times 10^{10}$ dyn/cm$^2$. Therefore, proper materials can be individually selected as a substrate and a cover layer, respectively, and then be combined. Accordingly, the degree of selection of materials can be raised, making it possible to produce a flexible wiring board suitable for the purpose.

The present invention will be further described in the following examples and comparative examples, but the present invention should not be construed as being limited thereto.

1) Preparation of Flexible Wiring Board

The substrate and cover layer described later were used. A predetermined circuit pattern was then formed on the substrate by subtractive method. The substrate and the cover layer were then contact-bonded to each other under hot press. The adhesive layer on the cover layer was then cured to prepare a flexible wiring board.

EXAMPLE 1

As a substrate, used was ESPANEX (substrate comprising a polyimide film (thickness: 25 μm) formed directly on a rolled copper foil (thickness: 35 μm): produced by Nippon Steel Chemical Co., Ltd.).

A cover layer was prepared by applying an epoxy-nitrile butyl rubber adhesive to a Kapton V (polyimide film, produced by Toray Du Pont) film having a thickness of 25 μm to provide an adhesive layer having a thickness of 25 μm.

The flexible wiring board of Example 1 thus obtained comprises a polyimide film and an epoxy-nitrile butyl rubber adhesive provided in direct contact with the respective surface of a rolled copper foil.

EXAMPLE 2

A substrate was prepared by applying an epoxy-nitrile butyl rubber adhesive to a Kapton V (polyimide film, produced by Toray Du Pont) film having a thickness of 25 µm to provide an adhesive layer having a thickness of 15 µm, laminating a rolled copper foil A having a thickness of 35 µm onto the film, and then curing the adhesive under pressure.

A cover layer was prepared by applying a butyral adhesive to a Kapton V (polyimide film, produced by Toray Du Pont) film having a thickness of 25 µm to provide an adhesive layer having a thickness of 25 µm.

The flexible wiring board of Example 2 thus obtained comprises an epoxy-nitrile butyl adhesive layer and a butyral adhesive layer provided in direct contact with the respective surface of a rolled copper foil.

COMPARATIVE EXAMPLE 1

A substrate was prepared by applying an epoxy-nitrile butyl rubber adhesive to a Kapton V (polyimide film, produced by Toray Du Pont) film having a thickness of 25 µm to provide an adhesive layer having a thickness of 15 µm, laminating a rolled copper foil A having a thickness of 35 µm onto the film, and then curing the adhesive under pressure.

A cover layer was prepared by applying an epoxy-nitrile butyl rubber adhesive to a Kapton V (polyimide film, produced by Toray Du Pont) film having a thickness of 25 µm to provide an adhesive layer having a thickness of 25 µm.

The flexible wiring board of Comparative Example 1 thus obtained comprises an epoxy-nitrile butyl adhesive layer provided in direct contact with both surfaces of a rolled copper foil.

COMPARATIVE EXAMPLE 2

A substrate was prepared by applying an epoxy-acryl rubber adhesive to a Kapton V (polyimide film, produced by Toray Du Pont) film having a thickness of 25 µm to provide an adhesive layer having a thickness of 15 µm, laminating a rolled copper foil A having a thickness of 35 µm onto the film, and then curing the adhesive under pressure.

A cover layer was prepared by applying an epoxy-acryl rubber adhesive to a Kapton V (polyimide film, produced by Toray Du Pont) film having a thickness of 25 µm to provide an adhesive layer having a thickness of 25 µm.

The flexible wiring board of Comparative Example 2 thus obtained comprises an epoxy-acryl rubber adhesive layer provided in direct contact with both surfaces of a rolled copper foil.

2) Measurement of Complex Shear Modulus

The adhesive layers (epoxy-nitrile butyl rubber adhesive, butyral adhesive, epoxy-acryl rubber adhesive) and polyimide film used as layers in direct contact with the respective surface of the rolled copper foil in the foregoing examples and comparative examples were measured for dynamic visco elasticity. The complex shear modulus ($G^*$) at a temperature of 60° C. and a frequency of 25 Hz and at a temperature of 80° C. and a frequency of 25 Hz was determined from the results. The measurement conditions are described below. The results are set forth in Table 1.

a) Adhesive Layer (epoxy-nitrile butyl rubber adhesive, butyral adhesive, epoxy-acryl rubber adhesive)

Apparatus used: ARES 2K-FRTN1 (produced by Rheometric Scientific Co., Ltd.), Torsion Rectangular mode, strain: 0.3%

Measurement temperature range: 0–200° C.

Temperature rise rate: 5° C./min

Frequency (rad/sec): 0.1, 0.32, 1.0, 3.2, 10, 100

Preparation of specimen: The various adhesives were each applied to the separator, and then half-cured. The adhesive was peeled from the separator, folded, press-molded into a predetermined shape (1 mm (T)×12 mm (W)×40 mm (L)) at a temperature of 150° C. for 1 hour, and then released from the mold. The adhesive was then post-cured at a temperature of 150° C. for 6 hours. The material thus processed was then polished on the surface thereof with a sandpaper to give a specimen.

The complex shear modulus ($G^*$) at a temperature of 60° C. and a frequency of 25 Hz was determined by extrapolating the value at 25 Hz from the complex shear modulus ($G^*$) measured at a temperature of 60° C. and various frequencies under the foregoing conditions. Similarly, the complex shear modulus ($G^*$) at a temperature of 80° C. and a frequency of 25 Hz was determined by extrapolating the value at 25 Hz from the complex shear modulus ($G^*$) measured at a temperature of 80° C. and various frequencies under the foregoing conditions.

b) Measurement of Polyimide Film

Apparatus used: DMS-210 (produced by Seiko Instrument Inc.)

Measurement temperature range: 30–200° C.

Temperature rise rate: 10° C./min

Frequency (Hz): 3.0

Preparation of specimen: The flexible wiring board was subjected to etching to remove the copper foil therefrom. The polyimide film thus left was cut into a predetermined shape (0.025 mm (T)×10 mm (W)×20 mm (L)) to give a specimen.

For the measurement of complex shear modulus ($G^*$) at a temperature of 60° C. and a frequency of 25Hz, the complex elastic modulus ($E^*$) at a frequency of 3 Hz and various temperatures were converted according to temperature-time conversion rule to determine the value at a temperature of 10° C. lower than 60° C. as complex elastic modulus ($E^*$) at a frequency of 25 Hz. Subsequently, the complex elastic modulus ($E^*$) at a frequency of 25 Hz was converted to complex shear modulus ($G^*$) according to the foregoing equation (1) to determine the complex shear modulus ($G^*$) at a temperature of 60° C. and a frequency of 25 Hz. In the foregoing equation (1), Poisson's ratio ($\gamma$) is 0.3. The complex shear modulus ($G^*$) at a temperature of 80° C. and a frequency of 25 Hz was similarly determined. In some detail, the complex elastic modulus ($E^*$) at a frequency of 3 Hz and various temperatures were converted according to temperature-time conversion rule to determine the value at a temperature of 10° C. lower than 80° C. as complex elastic modulus ($E^*$) at a frequency of 25 Hz. Subsequently, the complex elastic modulus ($E^*$) at a frequency of 25 Hz was converted to complex shear modulus ($G^*$) according to the foregoing equation (1) to determine the complex shear modulus ($G^*$) at a temperature of 80° C. and a frequency of 25 Hz ($\gamma$=0.3).

TABLE 1

| Adhesive layer/film | Complex shear modulus ($G^*$) at 25 Hz | |
|---|---|---|
| | 60° C. | 80° C. |
| Epoxy-nitrile butyl rubber adhesive | $7.01 \times 10^9$ | $3.28 \times 10^9$ |
| Butyral adhesive | $1.89 \times 10^{10}$ | $1.31 \times 10^{10}$ |
| Epoxy-acryl rubber adhesive | $7.40 \times 10^9$ | $6.15 \times 10^9$ |
| Polyimide film | $1.87 \times 10^9$ | $1.64 \times 10^{10}$ |

3) Flexing Characteristics

The flexible wiring boards obtained in the foregoing examples and comparative examples were used as specimens. These specimens were each mounted on an FPC flexing tester (SEK-31B4S, produced by Shin-Etsu Engineering Co., Ltd.) while being bent with the cover layer positioned therein side. The specimen was then measured for flex life in accordance with IPC-240C (IPC: THE INSTITUTE FOR INTERCONNECTING AND PACKAGING ELECTRONIC CIRCUITS) under the following conditions. The results are set forth in Table 2. Table 2 also shows the complex shear modulus (G*) of the layers in direct contact with the substrate side and cover layer side of the rolled copper foil in the foregoing examples and comparative examples at a temperature of 60° C. and a frequency of 25 Hz determined above and their average (G*).

Temperature: 60° C., 80° C.

Radius of curvature: R2.0 mm, R3.0 mm

Flexing rate: 1,500 times/min (25 Hz)

Stroke: 25 mm

Criterion of life: Number of flexings required until the dc resistivity of the rolled copper foil in the specimen shows an increase of 80% from the initial value The flexible wiring board according to the present invention is effective when the average complex shear modulus of the layers in direct contact with the respective surface of the conductor layer at a temperature of 60° C. and a frequency of 25 Hz falls within the range of from $1.0 \times 10^{10}$ to $4 \times 10^{10}$ dyn/cm$^2$. Therefore, proper materials can be individually selected as a substrate and a cover layer, respectively, and then be combined. Accordingly, the degree of selection of materials can be raised, making it possible to produce a flexible wiring board suitable for the purpose.

While the invention has been described in detail and with reference to specific embodiments thereof, it will be apparent to one skilled in the art that various changes and modifications can be made therein without departing from the spirit and scope thereof.

What is claimed is:

1. A flexible wiring board comprising an insulation layer provided on both surfaces of a conductor layer, optionally with an adhesive layer provided between the conductor layer and either one or both of said insulation layers, wherein the layers which are in direct contact with both surfaces of the conductor layer exhibit an average complex shear modulus value of from $1.0 \times 10^{10}$ to $4 \times 10^{10}$ dyn/cm$^2$ at a temperature of 60° C. and a frequency of 25 Hz.

TABLE 2

| Testing Temperature | Example No. | Complex Shear Modulus (dyn/cm$^2$) of Layers in Direct Contact With the Respective Surface of Copper Foil at 25 Hz | | | Flex Life (Number of Flexings) | |
|---|---|---|---|---|---|---|
| | | Substrate Side | Cover Layer side | Average Value | R2.0 mm | R3.0 mm |
| 60° C. | Example 1 | $1.87 \times 10^{10}$ | $7.01 \times 10^{9}$ | $1.29 \times 10^{10}$ | $1.28 \times 10^{6}$ | $6.55 \times 10^{6}$ |
| | Example 2 | $7.01 \times 10^{9}$ | $1.89 \times 10^{10}$ | $1.30 \times 10^{10}$ | $9.22 \times 10^{5}$ | $9.50 \times 10^{6}$ |
| | Comparative Example 1 | $7.01 \times 10^{9}$ | $7.01 \times 10^{9}$ | $7.01 \times 10^{9}$ | $1.58 \times 10^{5}$ | $7.22 \times 10^{5}$ |
| | Comparative Example 2 | $7.40 \times 10^{9}$ | $7.40 \times 10^{9}$ | $7.40 \times 10^{9}$ | $1.48 \times 10^{5}$ | $1.42 \times 10^{6}$ |
| 80° C. | Example 1 | $1.64 \times 10^{10}$ | $3.28 \times 10^{9}$ | $9.84 \times 10^{9}$ | $2.58 \times 10^{5}$ | $1.40 \times 10^{6}$ |
| | Example 2 | $3.28 \times 10^{9}$ | $1.31 \times 10^{10}$ | $8.19 \times 10^{9}$ | $1.67 \times 10^{5}$ | $1.19 \times 10^{6}$ |
| | Comparative Example 1 | $3.28 \times 10^{9}$ | $3.28 \times 10^{9}$ | $3.28 \times 10^{9}$ | 86,400 | $2.12 \times 10^{5}$ |
| | Comparative Example 2 | $6.15 \times 10^{9}$ | $6.15 \times 10^{9}$ | $6.15 \times 10^{9}$ | 92,000 | $3.96 \times 10^{5}$ |

As can be seen in Table 2, the flexible wiring boards of Examples 1 and 2, which have an arrangement such that the layers on the substrate side and cover layer side exhibit an average complex shear modulus (G*) value of not less than $1.0 \times 10^{10}$ dyn/cm$^2$ at a temperature of 60° C. and a frequency of 25 Hz (or the layers on the substrate side and cover layer side exhibit an average complex shear modulus (G*) value of not less than $0.8 \times 10^{10}$ dyn/cm$^2$ at a temperature of 80° C. and a frequency of 25 Hz), each exhibit a prolonged flex life as compared with those of Comparative Examples 1 and 2, which each exhibit a lower average complex shear modulus (G*) value.

Figure 4:
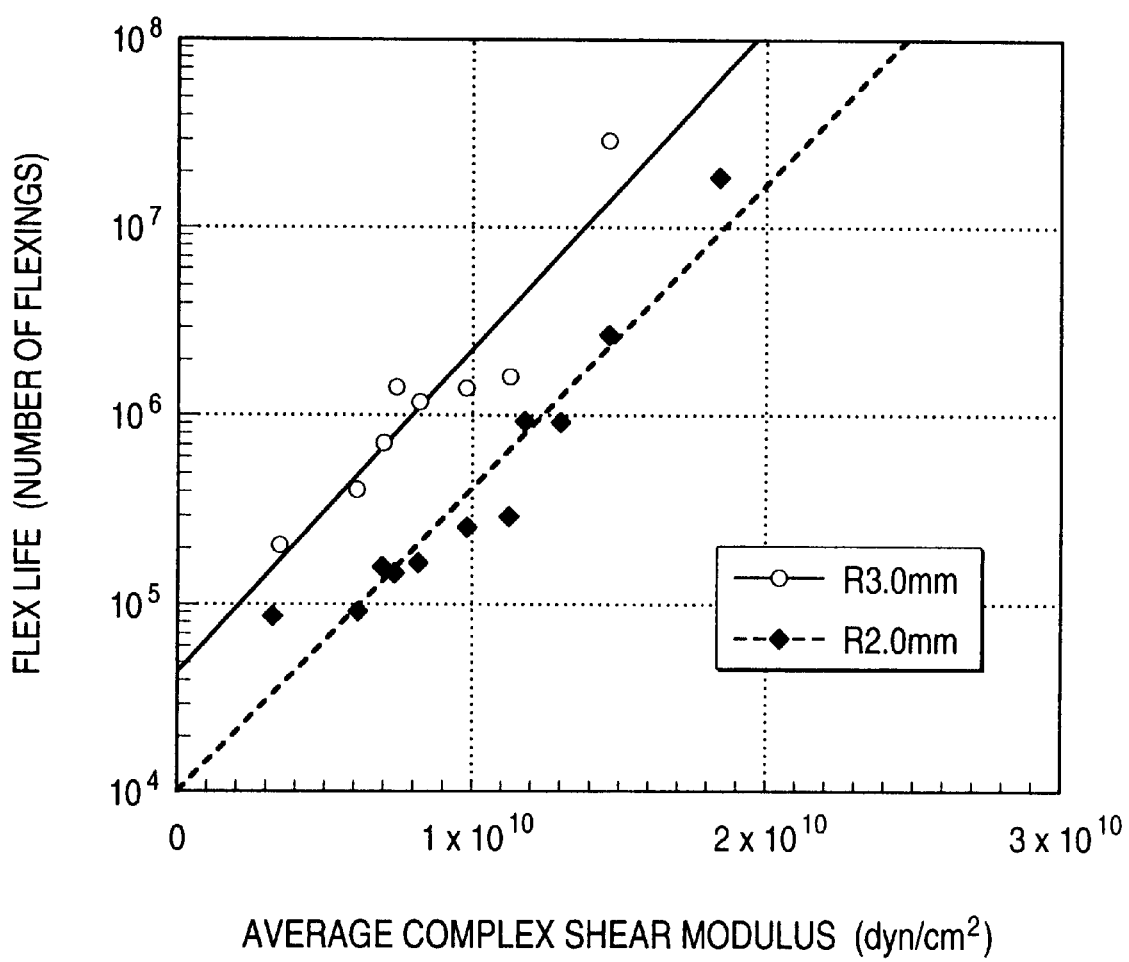
FIG. 4 is a graph illustrating the relationship between the average complex shear modulus and the flex life, wherein the symbol B represents a substrate, the symbol BP represents a substrate plastic film, the symbol BAd represents an adhesive layer (substrate side), the symbol M represents a metal foil, the symbol C represents a cover layer, the symbol CP represents a cover layer plastic film, and the symbol CAd represents an adhesive layer (cover layer side).

The relationship between the average complex shear modulus (G*) value and the flex life is shown in FIG. 4. As can be seen in FIG. 4, there is a considerably high correlation between the average complex shear modulus (G*) value and the flex life.

As mentioned above, the flexible wiring board according to the present invention exhibits a sufficient flex life even under high temperature working conditions and thus is suitable for use with electric apparatus and electronic apparatus, particularly computer peripheral, which has recently shown a tendency for the rise in the internal temperature with the enhancement of performance and improvement of mobility.

2. The flexible wiring board of claim 1, wherein said insulation layers are in direct contact with both surfaces of said conductor layer and each of said insulation layers exhibits an average complex shear modulus value of from $1.0 \times 10^{10}$ to $4 \times 10^{10}$ dyn/cm$^2$ at a temperature of 60° C. and a frequency of 25 Hz.

3. The flexible wiring board of claim 1, wherein two of said adhesive layers are present, each one is in direct contact with a respective surface of said conductor layer, and each of said adhesive layers exhibits an average complex shear modulus value of from $10.0 \times 10^{10}$ to $4 \times 10^{10}$ dyn/cm$^2$ at a temperature of 60° C. and a frequency of 25 Hz.

4. The flexible wiring board of claim 3, wherein said adhesive layer directly contacting said one surface of the conductor layer comprises an epoxy-nitrile butyl rubber adhesive, and the other said adhesive layer directly contacting the opposing surface of the conductor layer comprises a butyral adhesive.

5. The flexible wiring board of claim 4, wherein said conductor layer comprises a rolled copper foil.

6. The flexible wiring board of claim 1, wherein one said adhesive layer is present, in direct contact with one respective surface of said conductor layer, and said adhesive layer and said insulation layer in direct contact with the opposing respective surface of the conductor layer, without any adhesive layer interposed therebetween, exhibit an average complex shear modulus value of from $1.0 \times 10^{10}$ to $4 \times 10^{10}$ dyn/cm$^2$ at a temperature of 60° C. and a frequency of 25 Hz.

7. The flexible wiring board of claim 6, wherein said adhesive layer directly contacting said one surface of the conductor layer comprises an epoxy-nitrile butyl rubber adhesive, and said other surface of the conductor layer directly contacts said insulation layer comprising a polyimide film.

8. The flexible wiring board of claim 7, wherein said conductor layer comprises a rolled copper foil.

* * * * *